(12) United States Patent
Xia et al.

(10) Patent No.: US 7,375,965 B2
(45) Date of Patent: May 20, 2008

(54) CLIP AND HEAT DISSIPATION ASSEMBLY USING THE SAME

(75) Inventors: Wan-Lin Xia, Shenzhen (CN); Tao Li, Shenzhen (CN); Wei-Qiang Tian, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 43 days.

(21) Appl. No.: 11/309,621

(22) Filed: Sep. 1, 2006

(65) Prior Publication Data

US 2007/0274048 A1 Nov. 29, 2007

(30) Foreign Application Priority Data

May 26, 2006 (CN) .................... 2006 1 0060790

(51) Int. Cl.
*H05K 7/20* (2006.01)

(52) U.S. Cl. .............. 361/704; 361/719; 174/16.3; 165/80.3; 24/457; 257/719

(58) Field of Classification Search ............ 361/704, 361/710, 719; 24/457, 458; 257/E23.084, 257/E23.086; 174/16.3; 165/80.3; 16/223, 16/371

See application file for complete search history.

(56) References Cited

U.S. PATENT DOCUMENTS

| 6,229,705 | B1 |   | 5/2001  | Lee |
|-----------|----|---|---------|-----|
| 6,332,251 | B1 |   | 12/2001 | Ho et al. |
| 6,430,051 | B1 | * | 8/2002  | Yang et al. ............... 361/704 |
| 6,449,152 | B1 | * | 9/2002  | Lin ........................ 361/697 |
| 6,731,504 | B1 | * | 5/2004  | Liu ........................ 361/704 |
| 7,061,764 | B2 | * | 6/2006  | Lai et al. ................ 361/704 |
| 7,079,401 | B2 | * | 7/2006  | Lee et al. ................ 361/801 |
| 7,180,746 | B2 | * | 2/2007  | Yu et al. ................. 361/719 |
| 7,283,367 | B2 | * | 10/2007 | Yu et al. ................. 361/719 |
| 7,286,362 | B2 | * | 10/2007 | Yu et al. ................. 361/704 |
| 7,292,442 | B2 | * | 11/2007 | Yu et al. ................. 361/704 |
| 2004/0156171 | A1 | * | 8/2004 | Dong et al. ............. 361/704 |
| 2004/0179340 | A1 | * | 9/2004 | Lin ........................ 361/704 |
| 2006/0034057 | A1 | * | 2/2006 | Yang ....................... 361/704 |
| 2006/0171125 | A1 | * | 8/2006 | Yu et al. ................. 361/710 |
| 2007/0115638 | A1 | * | 5/2007 | Yu et al. ................. 361/704 |
| 2007/0230129 | A1 | * | 10/2007 | Chen ...................... 361/704 |

FOREIGN PATENT DOCUMENTS

| CN | 2431589 Y | 5/2001 |
|----|-----------|--------|
| CN | 2620926 Y | 6/2004 |

* cited by examiner

*Primary Examiner*—Jayprakash Gandhi
*Assistant Examiner*—Courtney L Smith
(74) *Attorney, Agent, or Firm*—Jeffrey T. Knapp

(57) ABSTRACT

A heat dissipation assembly comprises a mounting seat, a heat sink and a clip for fastening the heat sink in the mounting seat. The mounting seat defines an opening and is provided with a first and second protrusions. The heat sink is accommodated in the opening of the mounting seat. The clip comprises an elongated pressing member for pressing the heat sink and a clamping leg connected to one end of the pressing member and attached to the first protrusion of the mounting seat. An operating member, defining a notch, is pivotably attached to the other end of the pressing member and is rotatable relative to the pressing member and the second protrusion of the mounting seat slides in the notch of the operating member so that the clip switches between a release status and locking status.

18 Claims, 5 Drawing Sheets

CLIP AND HEAT DISSIPATION ASSEMBLY USING THE SAME

FIELD OF THE INVENTION

The present invention generally relates to fastening devices, and more particularly to a clip and heat dissipation assembly using the clip.

DESCRIPTION OF RELATED ART

Electronic components, such as integrated circuit packages, can generate large amounts of heat when operating. Unless removed in time, accumulated heat may reduce the operational efficiency of the electronic component. Nowadays, most electronic components are provided with a heat sink to disperse heat from the component in order to prevent the accumulation of heat. In order to ensure secure contact between the heat sink and the electronic component a clip is necessary to firmly attach one to the other. A clip must be designed to adapt to different structures of different heat sinks and related elements, such as retention modules. Furthermore, it should be easy to operate and should reliably fasten the heat sink. Multiform clips can be devised and used according to various heat sinks.

U.S. Pat. No. 6,229,705 B1 discloses a typical clip for a heat sink. The clip comprises a bent pressing beam, and two clamping legs which integrally descend from two ends of the pressing beam. Each clamping leg defines an aperture. The clip engages with a socket, provided with two protrusions, on a printed circuit board to fasten a heat sink to an electronic component mounted in the socket. A T-shaped handle is attached to the joint of the pressing beam and the clamping leg for conveniently holding the clamping leg. When mounting the heat sink, the pressing beam is placed on the heat sink and the two clamping legs extend down from two opposite sides of the heat sink. One of the clamping legs is attached to one of the protrusions of the socket. A downward force is applied to the handle to attach the other clamping leg to the protrusion of the socket so that the pressing beam presses the heat sink tightly onto the electronic component.

In order to fasten the heat sink securely, the pressing beam of the clip is needs to be rigid. A larger amount of force is therefore needed to make the clamping legs engage with the protrusions of the socket. Moreover, when there are many other electronic components around the socket and a limited operation space is left, it can be quite inconvenient to mount and remove the heat sink. Therefore an improved clip which can avoid the problems of the conventional clip is desirable.

Accordingly, what is needed is a heat dissipation assembly including a clip which is easy and timesaving to operate.

SUMMARY OF THE INVENTION

A heat dissipation assembly comprises a mounting seat, a heat sink and a clip for fastening the heat sink to the mounting seat. The mounting seat defines an opening and is provided with first and second protrusions. The heat sink is accommodated in the opening of the mounting seat. The clip comprises an elongated pressing member for pressing the heat sink and a clamping leg connected to one end of the pressing member and attached to the first protrusion of the mounting seat. An operating member, defining a notch, can be pivoted on the other end of the pressing member and is rotatable relative to the pressing member so that the second protrusion of the mounting seat slides in the notch of the operating member and allows the clip to be switchable between an unlocked status and a locked status.

BRIEF DESCRIPTION OF THE DRAWINGS

Many aspects of the present heat dissipation assembly can be better understood with reference to the following drawings. The components in the drawings are not necessarily drawn to scale, the emphasis instead being placed upon clearly illustrating the principles of the present heat dissipation assembly. Moreover, in the drawings, like reference numerals designate corresponding parts throughout the several views. Other advantages and novel features will become more apparent from the following detailed description of a preferred embodiment when taken in conjunction with the accompanying drawings, in which.

DETAILED DESCRIPTION OF THE INVENTION

Figure 1:
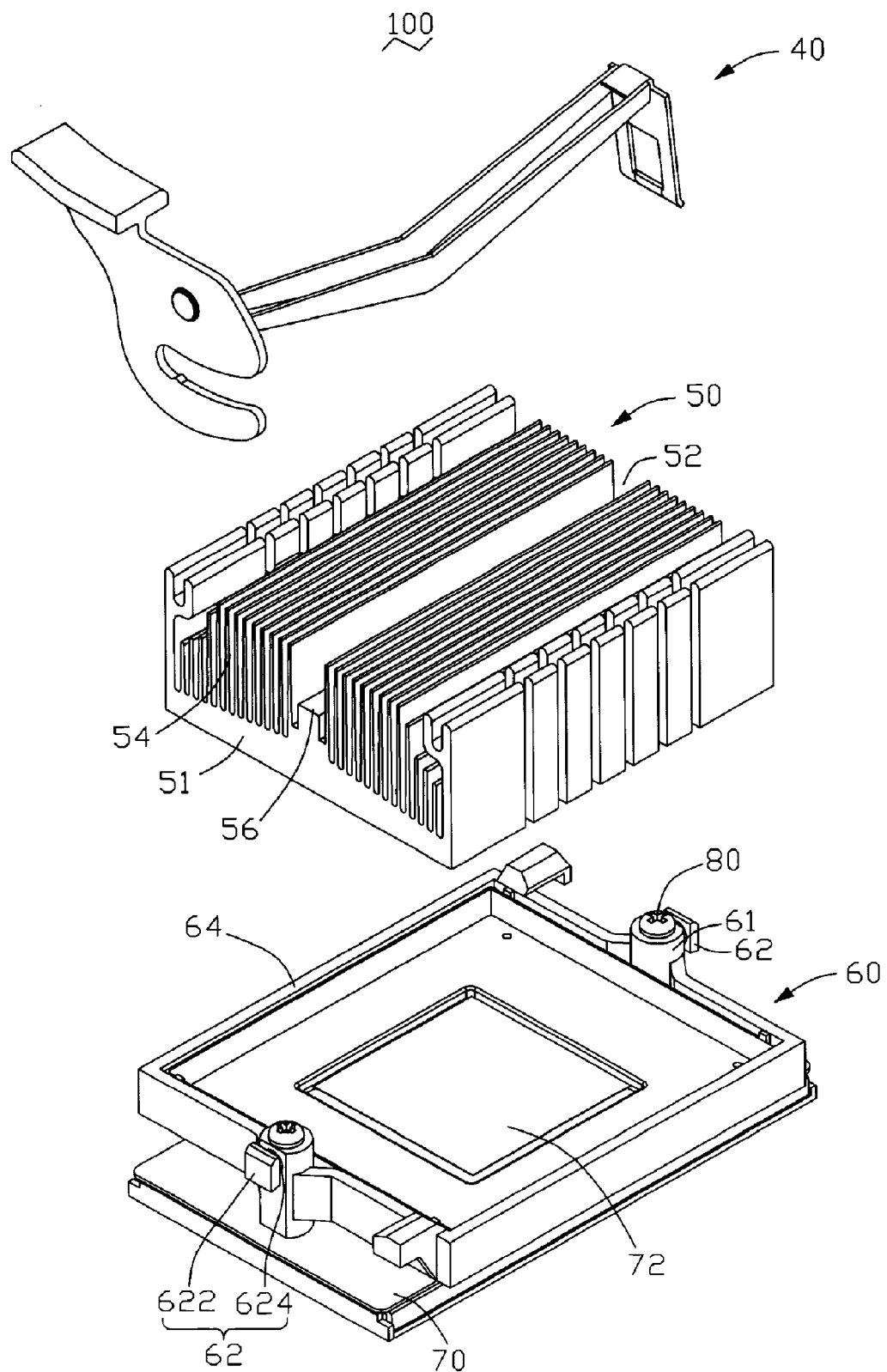
FIG. 1 is an exploded view of a heat dissipation assembly in accordance with a preferred embodiment of the present invention.

FIG. 1 illustrates a heat dissipation assembly 100 in accordance with a preferred embodiment of the present invention. The heat dissipation assembly 100 is used for dissipating heat from an electronic component 72, such as an integrated circuit package on a circuit board 70, comprising a mounting seat 60 on the circuit board 70, a heat sink 50, and a clip 40 for fixing the heat sink 50 in the mounting seat 60 in such a manner that the heat sink 50 contacts the electronic component 72.

The mounting seat 60 is a rectangular frame, comprising four sidewalls 64 surrounding an opening within which the electronic component 72 is located. Two columns 61 are formed on two opposing sidewalls 64 of the mounting seat 60. The mounting seat 60 is fixed to the circuit board 70 by two screws 80 passing through the columns 61 and extending into the circuit board 70. A first protrusion 62 and a second protrusion 62 extend laterally and outwardly from an outer side of either of the columns 61. Each protrusion 62 comprises a pole-shaped neck 624 and a rectangular head 622 expanding towards the free end of the neck 624.

The heat sink 50 comprises a rectangular base plate 51 and a plurality of parallel fins 54 extending from a top face of the base plate 51. A receiving channel 52 is defined on the top face of the base 51, parallel to the fins 54 and dividing the fins 54 into two groups. A ridge 56 protrudes upwardly from the base 51 into the channel 52 for supporting said clip 40.

Figure 2:
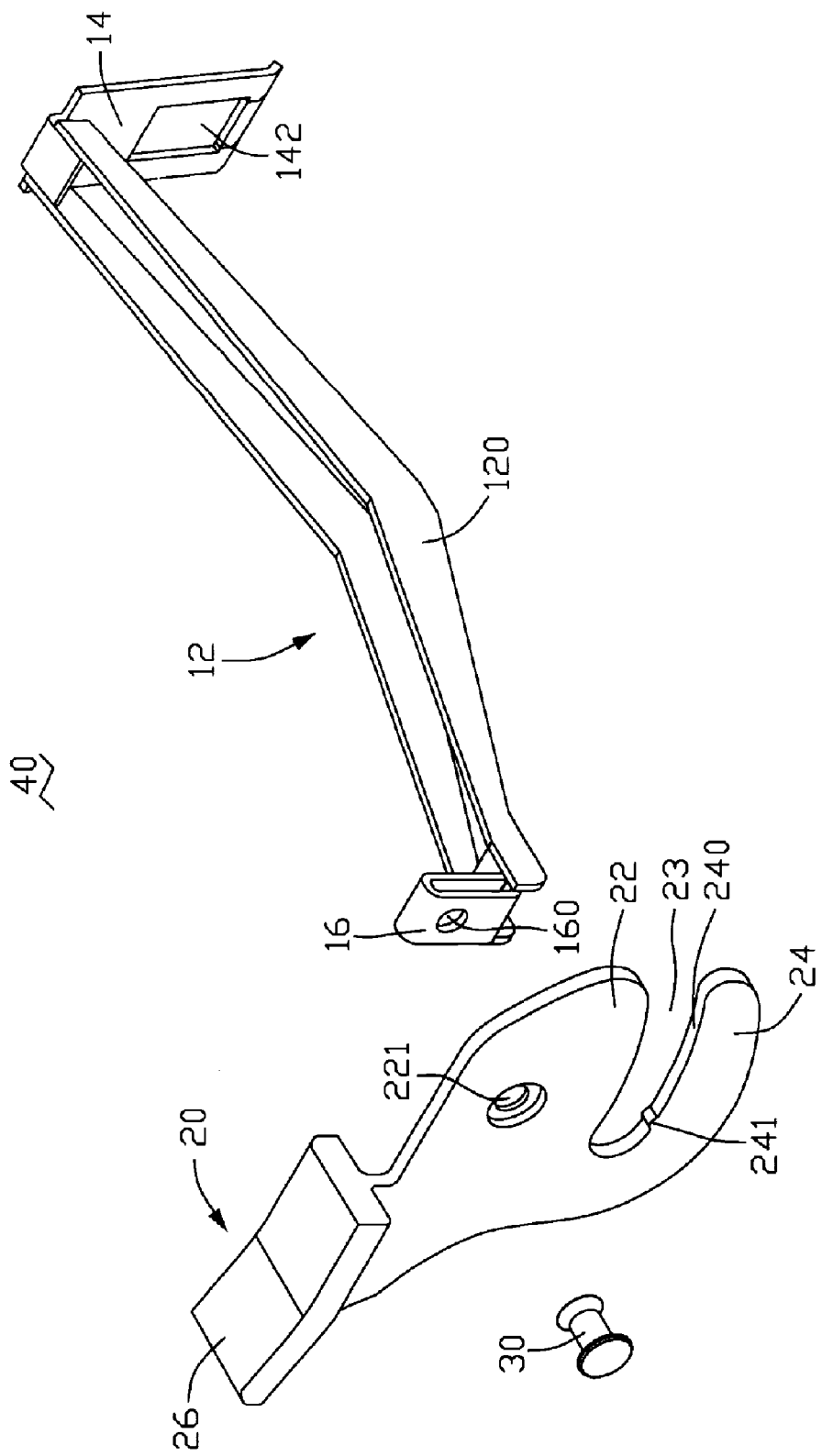
FIG. 2 is an exploded view of a clip of the heat dissipation assembly shown in FIG. 1.

The clip 40 is used to engage with the mounting seat 60 so as to make the heat sink 40 fastened within the opening of the mounting seat 60 and ensure contact with the electronic component 72 for dissipating heat therefrom. Referring to FIG. 2, the clip 40 comprises an elongated pressing member 12, a clamping leg 14 connected to one end of the pressing member 12, and an operating member 20 pivoted to the other end of the pressing member 12.

The pressing member 12 includes two spaced parallel v-shaped pressing beams 120, with middle portion thereof curved down. Two corresponding ends of the pressing beams 120 are jointed together. The clamping member 14 perpendicularly extends downwards from one of the joints of the pressing beams 120 and defines a rectangular aperture 142. The other end of the pressing member 12 forms an inverted U-shape flake 16, erected upwardly and perpendicular to the extension of the pressing member 12. The flake 16 defines a hole 160.

The operating member 20 comprises a connecting portion 22 and a detaining portion 24. The operating member 20 defines a notch 23 separating the connecting portion 22 and the detaining portion 24. The notch 23 has an arc-shaped contour line. The connecting portion 22 is pivotably attached to the flake 16 by a rivet 30 passing through a hole 221 defined in the connecting portion 22 and the hole 160 of the flake 16. The operating member 20 is rotatable around the joint in a plane that is perpendicular to the extension of the elongated pressing member 12. The detaining portion 24 has an engaging edge 240 adjacent to the notch 23 and extending inside the operating member 20. There is a gradually smaller distance between the engaging edge 240 and a joint, the hole 221 in this embodiment, where the operating member 20 is pivotably attached to the pressing member 12, from the entrance of the notch 23 to the inside of the operating member 20. A handle 26 is formed on the connecting portion 22 of the operating member 20, extending away from the detaining portion 24. The free end of the handle 26 is made to be thicker, which helps the operator to hold the operating member 20 during rotation. The operating member 20 is substantially parallel to the clamping member 14. A nose is 241 formed on the engaging edge 240 of the operating member 20, adjacent to the bottom of the notch 23.

Figure 3:
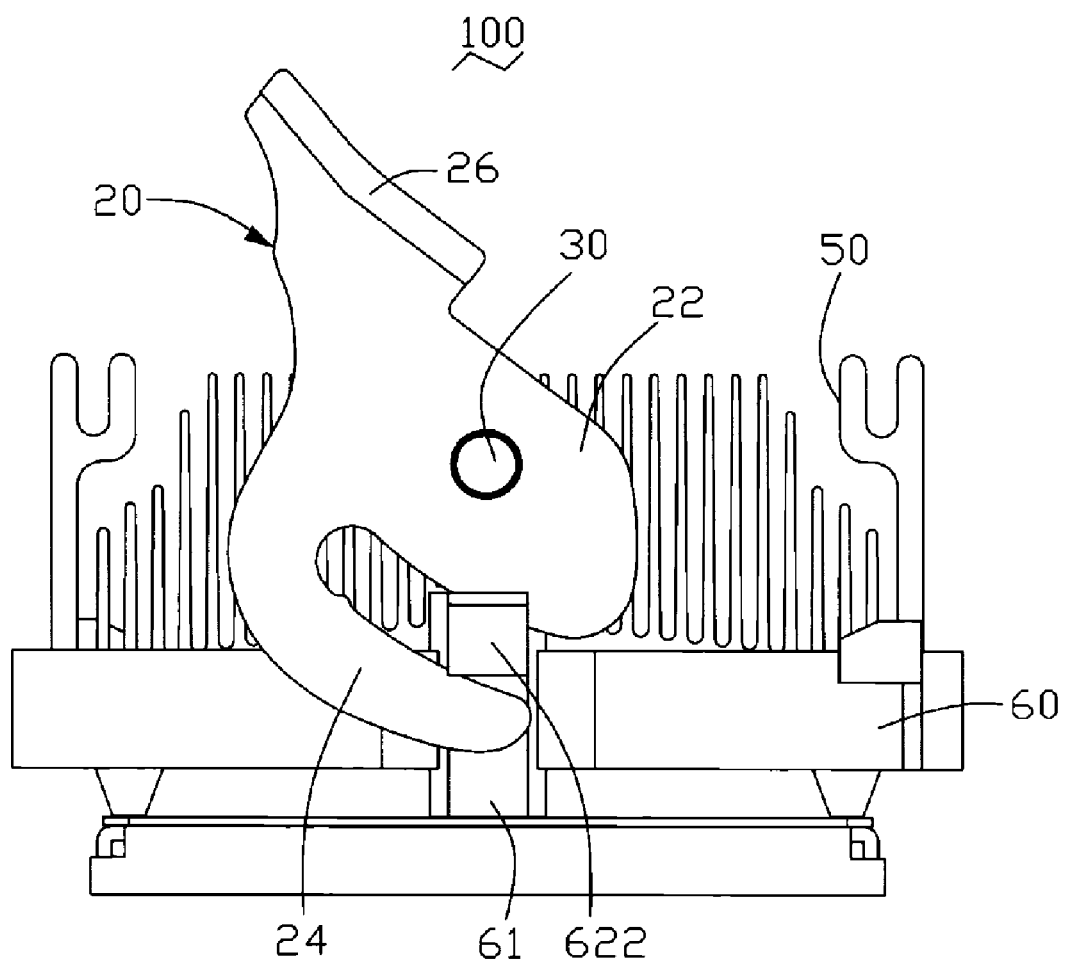
FIG. 3 is a side view of the heat dissipation assembly in accordance with the preferred embodiment of the present invention, with the clip unlocked.
Figure 4:
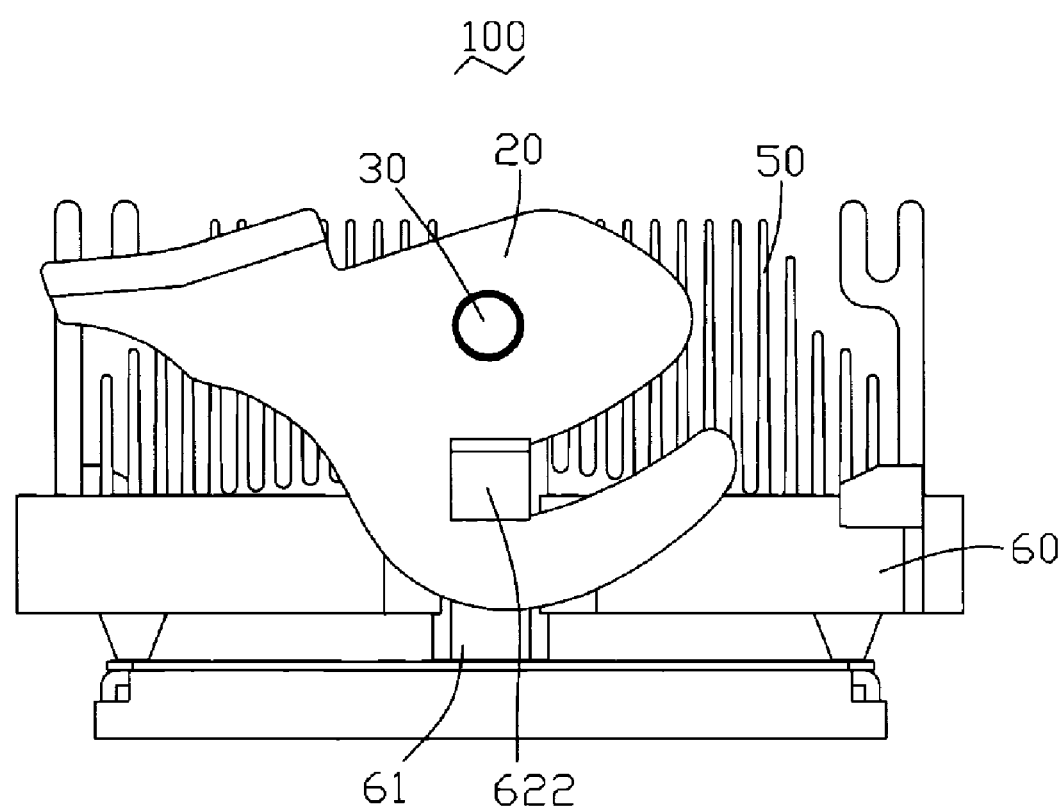
FIG. 4 is another side view of the heat dissipation assembly in accordance with the preferred embodiment of the present invention, with the clip locked.
Figure 5:
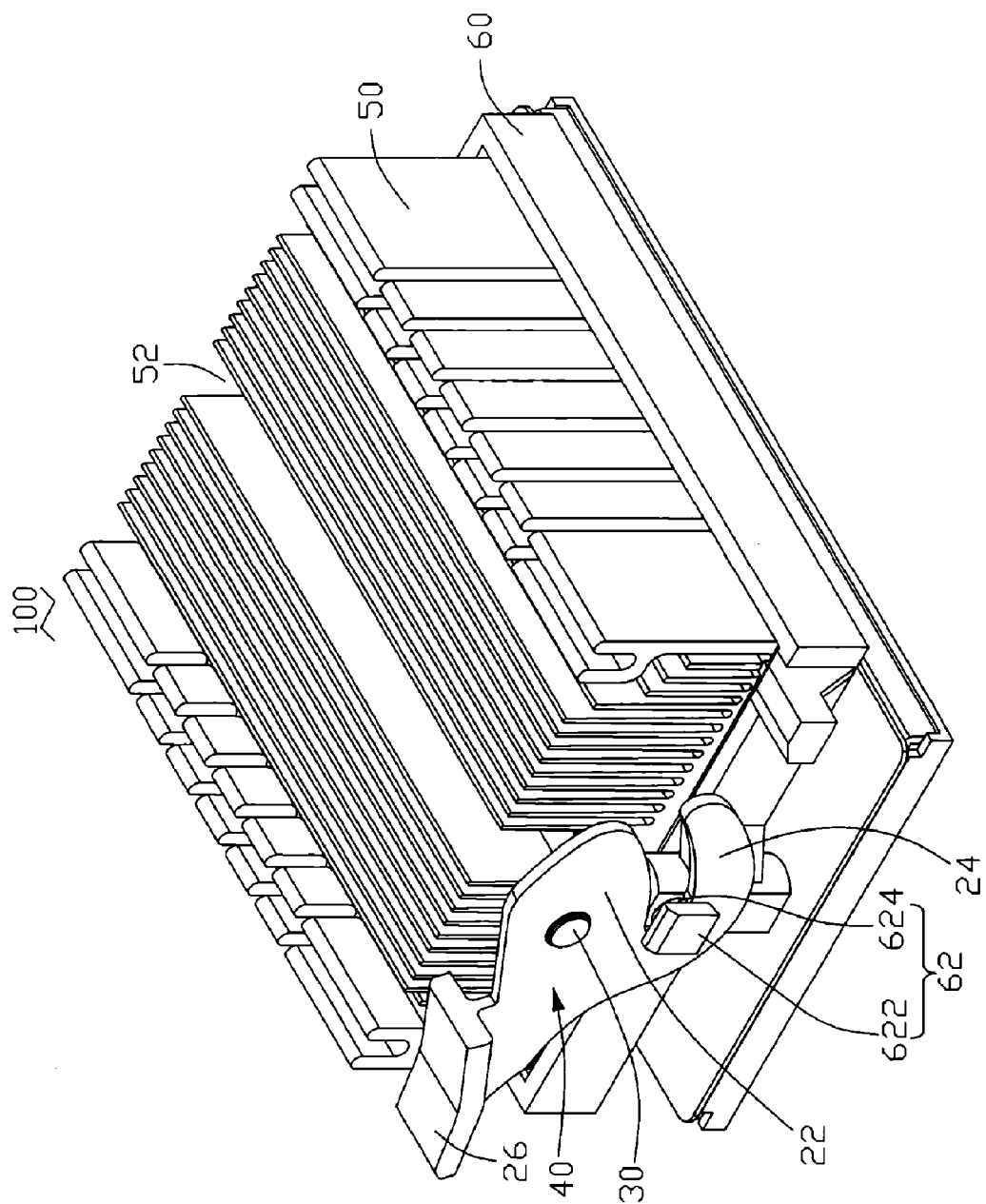
FIG. 5 is an isometric view of FIG. 4.

Referring to FIGS. 3-5 together, when mounting the heat sink 40, the heat sink 40 is placed in the mounting seat 60. The ridge 56 of the heat sink 50 is aligned with the columns 61, the first and second protrusion 62; the pressing member 12 is placed in the channel 52 of the heat sink 50 and supported by the ridge 56; the clamping member 14 is attached to the first protrusion 62, surrounding the neck 624 of the first protrusion 62 and detained by the head 622. The handle 26 of the operating member 20 is held and the operating member 20 is rotated to make the engaging edge 240 of the detaining portion 24 of the operating member 20 slide relative to the neck 624 of the second protrusion 62 of the mounting seat 60. Due to the way in which the distance between the engaging edge 240 and the hole 221 of the operating member 20 gets smaller as second protrusion 62 slides into the notch 23, the pressing member 12 presses the heat sink 50 down to the electronic component 72. When the second protrusion 62 slides over the nose 241 and to the bottom of the notch 23, the clip 40 is locked to and securely engages with the mounting seat 60, while the heat sink 50 is steadily fixed to contact the electronic component 72. When removing the heat sink 50, the operating member 20 should be pulled back to make the second protrusion 62 slide out of the notch 23 of the operating member 20, the heat sink 50 is then released from the clip 40 and can be pulled out of the mounting seat 60.

From above-described embodiment of the present invention, it can be seen that the heat sink 50 can be fastened in the mounting seat 60 and contacts the electronic component 72 by lateral rotation of the operating member 20, and also can be released by reverse rotation of the operating member 20 with ease. Little effort is needed to mount and remove the heat sink 50. Convenience of operation is obvious.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A clip for heat sink comprising:
   an elongated pressing member; including a first end and a second end, the second end having an extending portion projecting upwardly therefrom.
   a clamping leg connected to one end of the pressing member; and
   an operating member pivoted to the extending portion of the pressing member, which is rotatable in a plane perpendicular to an extension of the elongated pressing member;
   wherein the operating member defines a notch dividing the operating member into a connecting portion and a detaining portion, the detaining portion has an engaging edge configured for yielding a locking engagement and a distance between the engaging edge and a joint of the connecting portion and the pressing member gets smaller from an entrance of the notch to an inside of the operating member.

2. The clip as described in claim 1, wherein the pressing member is curved down in middle thereof.

3. The clip as described in claim 1, wherein the clamping leg integrally extends down from the pressing member and defines an aperture.

4. The clip as described in claim 1, wherein a handle is formed on the connecting portion of the operating member and extends away from the detaining portion.

5. The clip as described in claim 1, wherein a nose is formed on the engaging edge of the detaining portion of the operating member, adjacent to a bottom of the notch.

6. The clip as described in claim 1, wherein a rivet extends through the extending portion of the pressing member and the connecting portion of the operating member so as to pivotably connect the pressing member and the connection portion of the operating member together.

7. The clip as described in claim 1, wherein the pressing member comprises two parallel pressing beams, which curve down in a middle thereof.

8. The clip as described in claim 1, wherein the notch has an arc-shaped contour line.

9. A heat dissipation assembly comprising:
   a mounting seat defining an opening and provided with first and second protrusions;
   a heat sink accommodated in the opening of the mounting seat; and
   a clip comprising an elongated pressing member for pressing the heat sink toward the mounting seat; and the extending portion projecting upwardly from one end of the pressing member, a clamping leg connected to one end of the pressing member and attached to the first protrusion, and an operating member defining a notch and pivotably attached to the extending portion,
   wherein the operating member is rotatable relative to the pressing member so that the second protrusion of the mounting seat slides in the notch of the operating member and the clip can switch between a locked status and an unlocked status; the operating member is divided by the notch into a connecting portion pivoted to the pressing member and a detaining portion which is slidable relative to the second protrusion of the mounting seat; and the detaining portion has an engaging edge engaged with the second protrusion of the mounting seat, a distance between the engaging edge and a joint of the pressing member and the operating member becoming smaller from an entrance of the notch to an inside of the operating member.

10. The heat dissipation assembly as described in claim 9, wherein the notch has an arc-shaped contour line.

11. The heat dissipation assembly as described in claim 9, wherein the second protrusion is located between a nose on the engaging edge of the detaining portion and a bottom of the notch when the clip is in the locked status.

12. The heat dissipation assembly as described in claim 9, wherein a handle is formed on the connecting portion and extends away from the detaining portion.

13. The heat dissipation assembly as described in claim 9, wherein the heat sink comprises a base plate and a plurality of fins extending from the base plate, and the pressing member of the clip comprises two curved pressing beams situated in a channel between the fins of the heat sink.

14. The heat dissipation assembly as described in claim 9, wherein each protrusion of the mounting seat comprises a neck and a head expanding toward the end of the neck.

15. The heat dissipation assembly as described in claim 9, wherein the clamping leg defines an aperture for receiving the first protrusion of the mounting seat.

16. The heat dissipation assembly as described in claim 9, wherein the operating member is rotatable in a plane perpendicular to an extension of the pressing member.

17. A heat dissipation assembly comprising:
 a printed circuit board;
 a mounting seat mounted on the printed circuit board, defining a central opening and opposite first and second protrusions beside the central opening;
 a heat-generating electronic component mounted on the printed circuit board and received in the central opening of the mounting seat;
 a heat sink mounted on the heat-generating electronic component and thermally connecting therewith; and
 a clip having an elongated pressing member pressing on the heat sink toward the heat-generating electronic component, an extension of the pressing member projecting upwardly from the pressing member, a clamping leg integrally depending from one end of the pressing member and engaging with the first protrusion, and an operating member connecting with the extension of the pressing member and rotatable about a plane which is perpendicular to the extension of the pressing member, the operating member having an arc-shaped notch with an entrance and a bottom remote from the entrance, a distance between the notch and a pivotably connected point between the operating member and the extension of the pressing member being gradually decreased from the entrance to the bottom of the notch, the second protrusion being engagingly receivable in the notch, wherein when the second protrusion slides from the entrance to the bottom of the notch, the heat sink moves from an unlocked position to a locked position in which the heat sink tightly engages with the heat-generating electronic component.

18. The heat dissipation assembly as described in claim 17, wherein the operating member forms a nose in the notch near the bottom of the notch, the nose engaging with the second protrusion when the heat sink is at the locked position.

* * * * *